(12) United States Patent
Cao et al.

(10) Patent No.: US 7,482,654 B2
(45) Date of Patent: Jan. 27, 2009

(54) MOSGATED POWER SEMICONDUCTOR DEVICE WITH SOURCE FIELD ELECTRODE

(75) Inventors: Jianjun Cao, Torrance, CA (US); Timothy D. Henson, Torrance, CA (US); Naresh Thapar, Redondo Beach, CA (US); Paul Harvey, Chepstow (GB); David Kent, South Wales (GB)

(73) Assignee: International Rectifier Corporation, El Segundo, CA (US)

( * ) Notice: Subject to any disclaimer, the term of this patent is extended or adjusted under 35 U.S.C. 154(b) by 323 days.

(21) Appl. No.: 11/110,467

(22) Filed: Apr. 20, 2005

(65) Prior Publication Data

US 2006/0033154 A1 Feb. 16, 2006

Related U.S. Application Data

(60) Provisional application No. 60/582,898, filed on Jun. 25, 2004, provisional application No. 60/564,158, filed on Apr. 20, 2004.

(51) Int. Cl.
 *H01L 29/76* (2006.01)
(52) U.S. Cl. ........................ 257/339; 257/341
(58) Field of Classification Search ................ 257/330, 257/331, 339, 341, 488
 See application file for complete search history.

(56) References Cited

U.S. PATENT DOCUMENTS

| 5,326,711 | A | 7/1994 | Malhi |
| 5,998,833 | A | 12/1999 | Baliga |
| 6,750,105 | B2 | 6/2004 | Disney |
| 6,882,005 | B2 * | 4/2005 | Disney ........................ 257/328 |
| 2003/0132460 | A1 | 7/2003 | Tabuchi et al. |
| 2007/0210356 | A1 * | 9/2007 | Henson ...................... 257/288 |

FOREIGN PATENT DOCUMENTS

WO  WO 02/13257 A2  4/2007

OTHER PUBLICATIONS

German Office Action dated Apr. 30, 2007 in German Appln. No. 11 2005 001 434.7-33 and Summary of the Office Action in English.
International Search Report issued Dec. 15, 2005 in PCT Application Serial No. PCT/US05/22917.

* cited by examiner

*Primary Examiner*—Mark Prenty
(74) *Attorney, Agent, or Firm*—Ostrolenk, Faber, Gerb & Soffen, LLP

(57) ABSTRACT

A power semiconductor device which includes a source field electrode, and at least one insulated gate electrode adjacent a respective side of the source field electrode, the source field electrode and the gate electrode being disposed in a common trench, and a method for fabricating the device.

19 Claims, 7 Drawing Sheets

MOSGATED POWER SEMICONDUCTOR DEVICE WITH SOURCE FIELD ELECTRODE

RELATED APPLICATION

Figure 1:
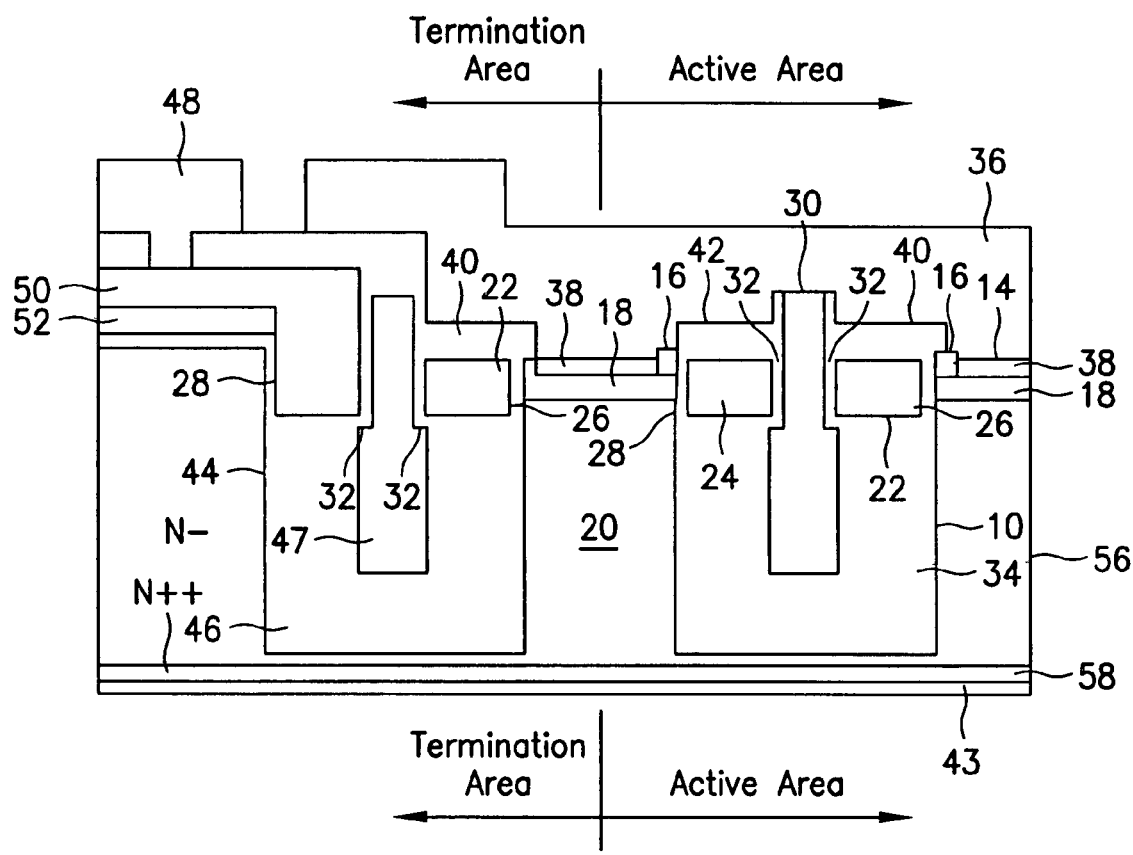

This application is based on and claims priority to U.S. Provisional Application No. 60/564,158, filed on Apr. 20, 2004, entitled Mid Voltage ACCUFET Structure, and further claims priority to U.S. Provisional Application No. 60/582,898, filed on Jun. 25, 2004, entitled Trench FET With Deep Source Poly Electrode and Process of Manufacture, the disclosures of which are incorporated by reference.

FIELD OF INVENTION

The present invention relates to power semiconductor devices and more particularly to MOSgated power semiconductor devices.

BACKGROUND OF THE INVENTION

The breakdown voltage and the operating resistance (On resistance or Rdson) are important characteristics of a power semiconductor device. The Rdson and the breakdown voltage of a power semiconductor device are inversely related. That is, the improvement in one adversely affects the other. To overcome this problem, U.S. Pat. No. 5,998,833 proposes a trench type power semiconductor in which buried electrodes are disposed within the same trench as the gate electrodes in order to deplete the common conduction region under reverse voltage conditions, whereby the breakdown voltage of the device is improved. As a result, the resistivity of the common conduction region can be improved without an adverse affect on the breakdown voltage.

The buried electrodes shown in U.S. Pat. No. '833 are electrically connected to the source contact of the device remotely, which may limit the switching speed of the device. Furthermore, the device shown therein may require at least one additional masking step.

U.S. Pat. No. 6,649,975 ('975 patent) and U.S. Pat. No. 6,710,403 ('403 patent) both show power semiconductor devices which include trenches that are deeper than the gate trenches to support field electrodes that are electrically connected to the source contact. The devices illustrated by the '975 patent and the '403 both require additional masking steps for defining trenches that receive field electrodes, which may increase the cost of production. In addition, the extra trenches increase the cell pitch and thus reduce cell density, which is undesirable.

SUMMARY OF THE INVENTION

A MOSgated power semiconductor device according to the present invention includes at least one gate electrode, and a source field electrode disposed within the same trench, the source field electrode being connected locally (i.e. within each unit cell) to obtain faster switching speed.

A device according to the preferred embodiment of the present invention includes an active area having at least one active cell, the active cell including at least one source region, a source contact electrode connected to the source region, a source field electrode electrically connected to the source contact and an insulated gate electrode adjacent one side of the source field electrode and a base region, the source field electrode extending to a depth below a depth of the insulated gate electrode and a height above a height of the insulated gate electrode, wherein the source field electrode and the insulated gate electrode reside within a common trench.

A device according to the present invention exhibits low Rdson, high breakdown voltage, very low Qgd, and very low Qgd/Qgs ratio.

Other features and advantages of the present invention will become apparent from the following description of the invention which refers to the accompanying drawings.

BRIEF DESCRIPTION OF THE DRAWING(S)

FIG. 1 schematically illustrates a cross-sectional view of a semiconductor device according to a preferred embodiment of the present invention.

Figure 2A:
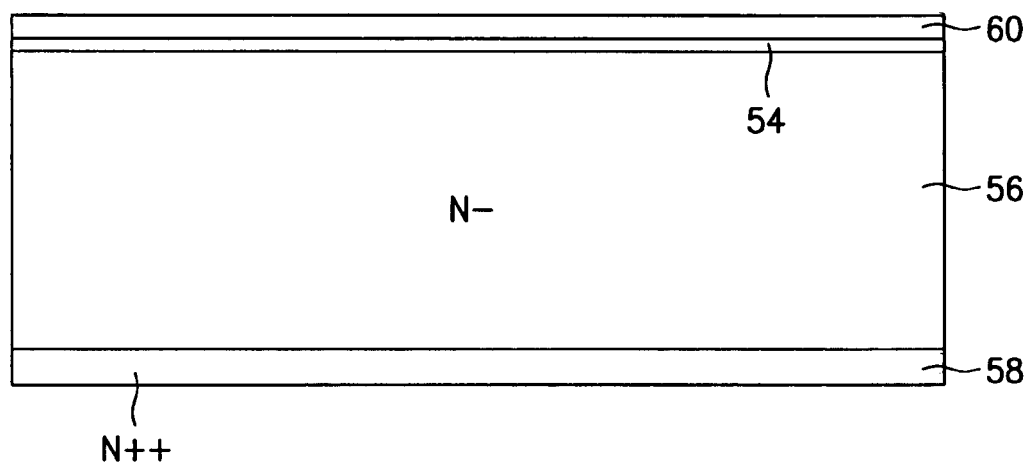
Figure 2B:
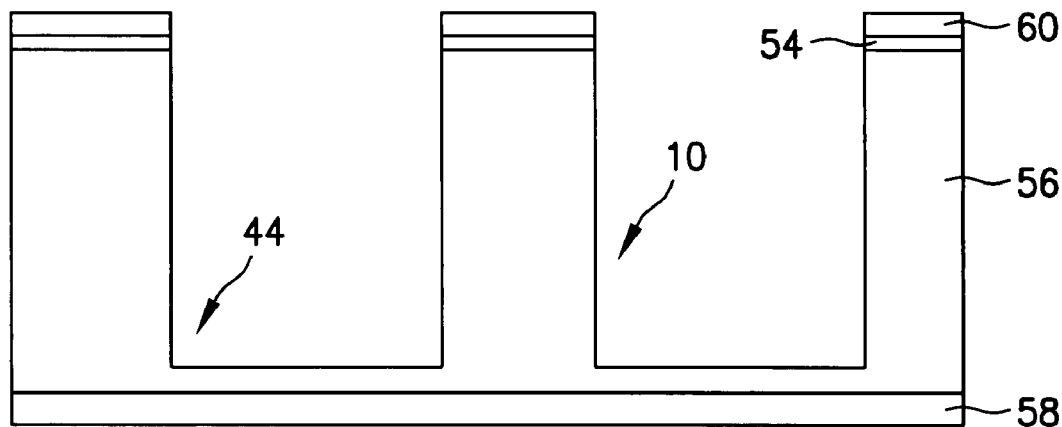
Figure 2C:
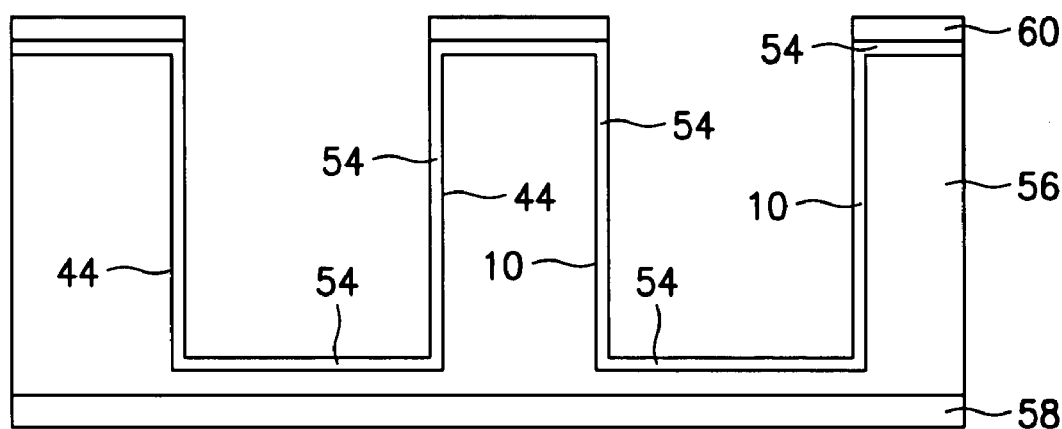
Figure 2D:
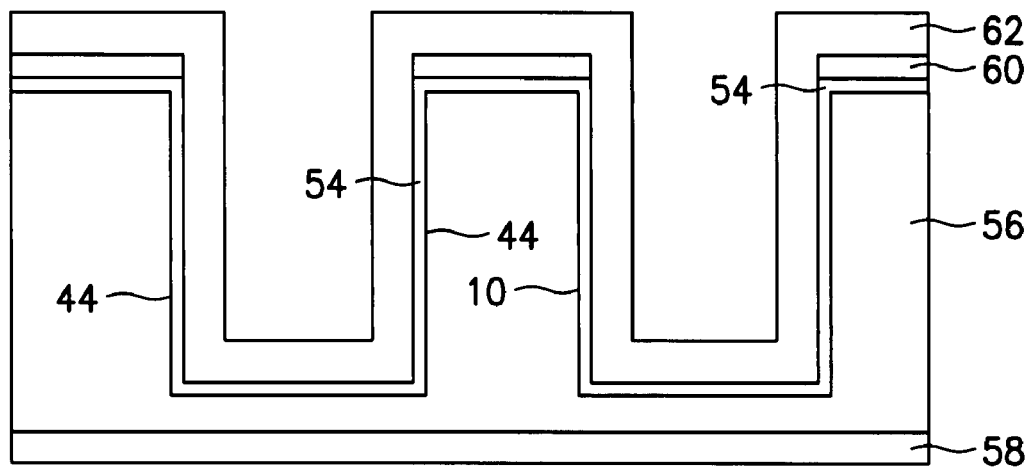
Figure 2E:
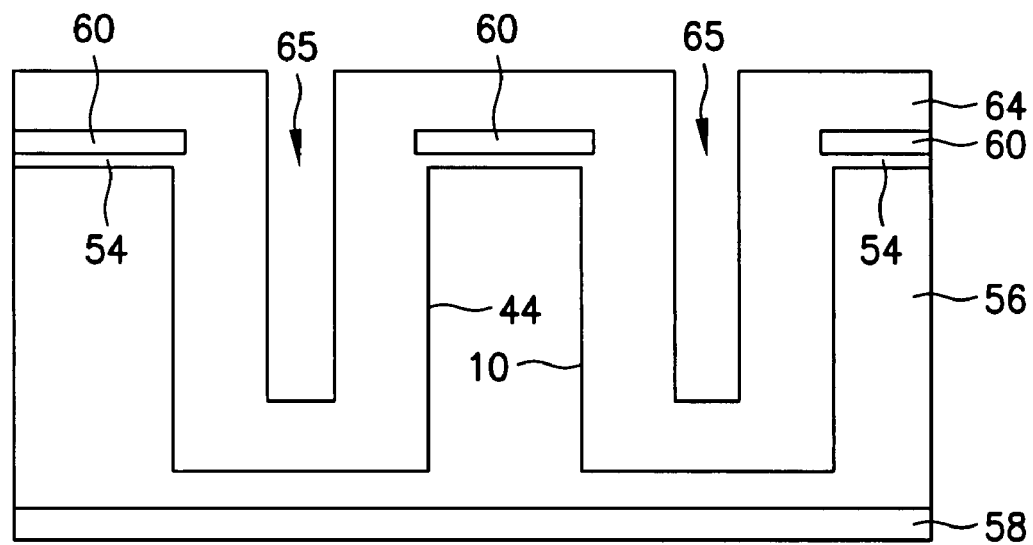
Figure 2F:
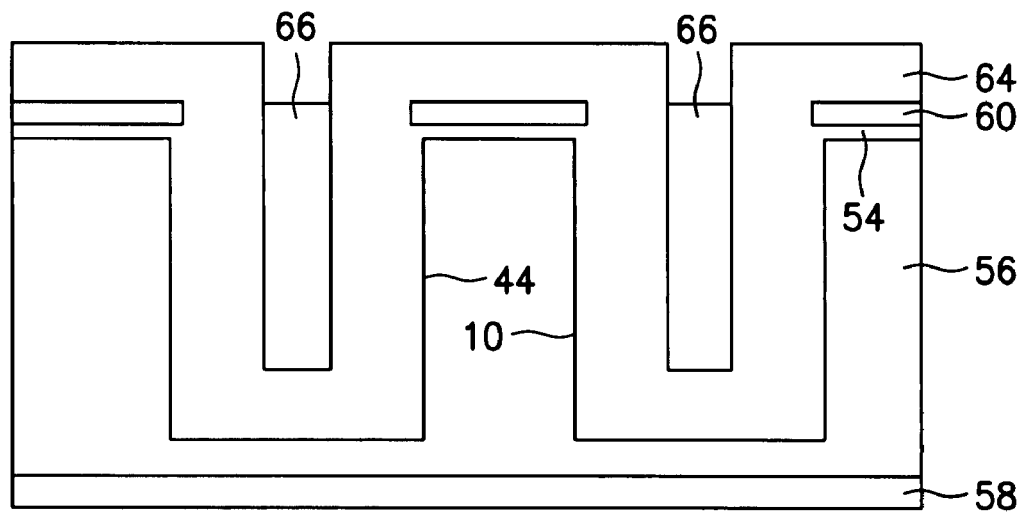
Figure 2G:
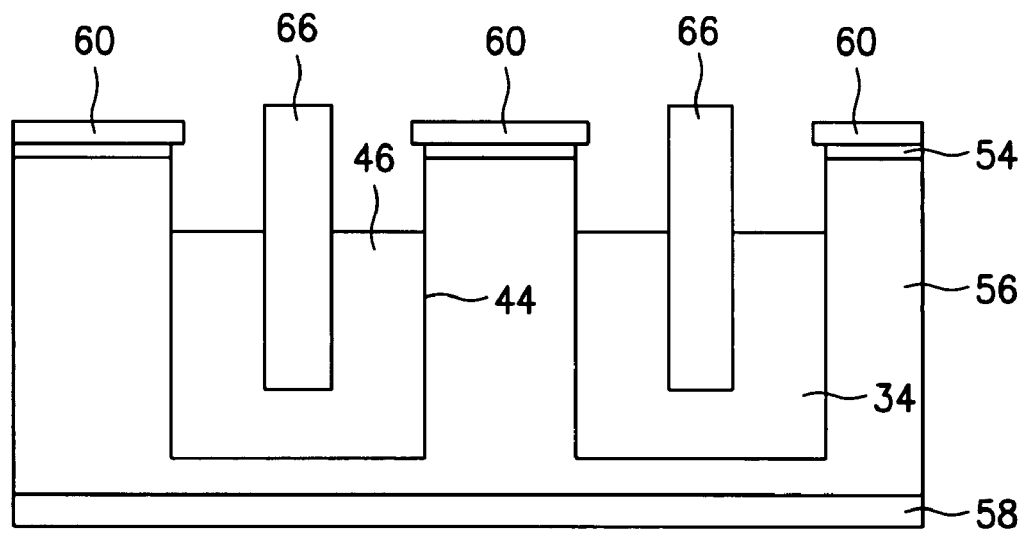
Figure 2H:
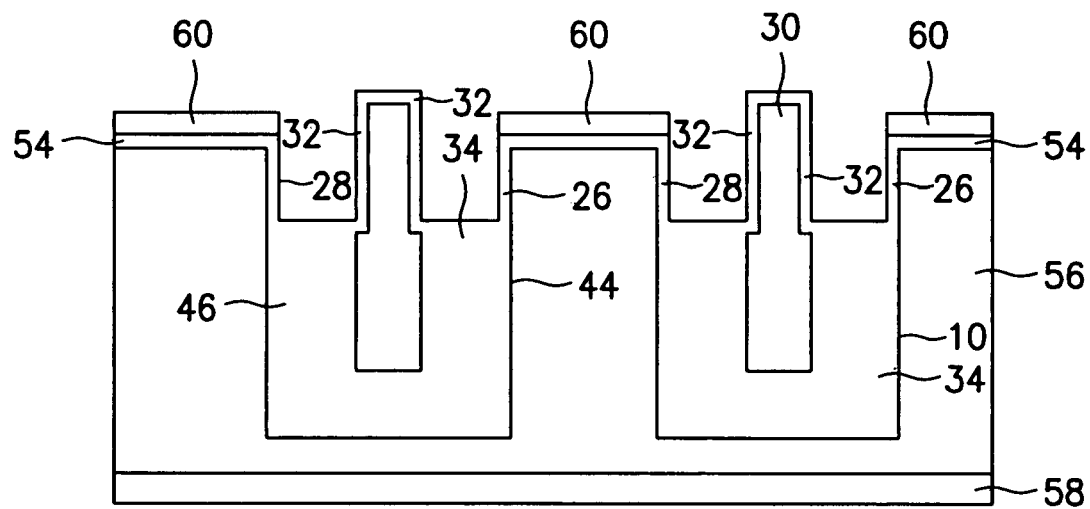
Figure 2I:
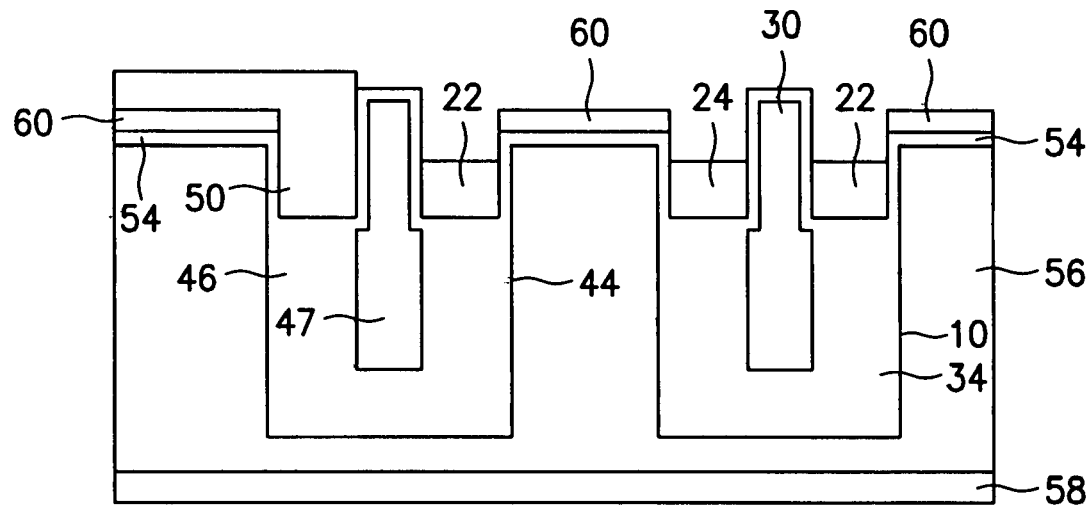
Figure 2J:
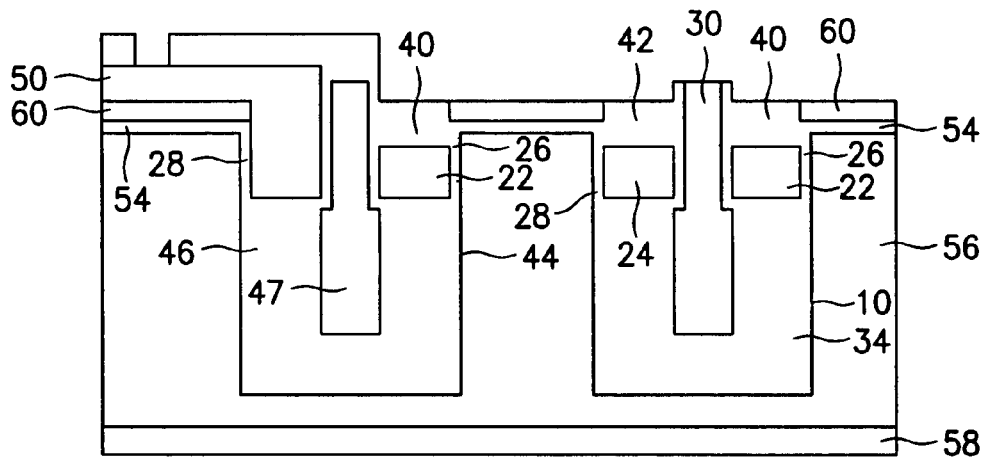
Figure 2K:
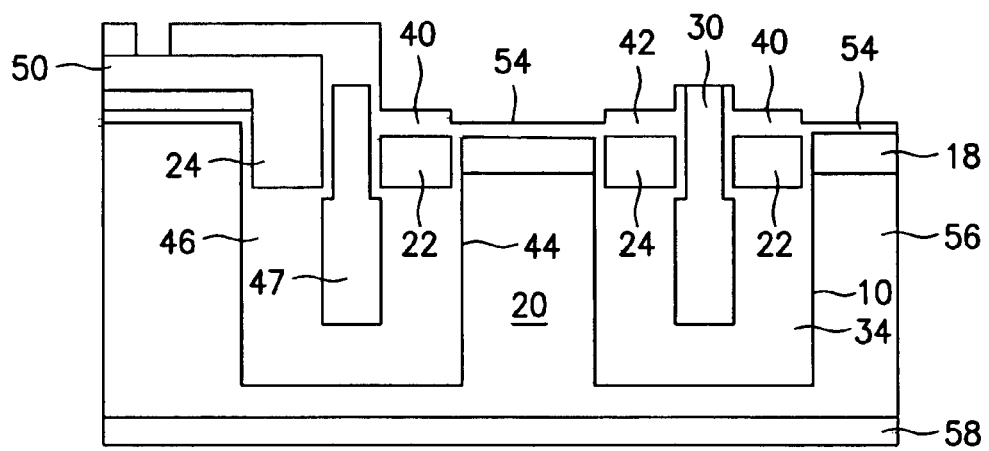
Figure 2L:
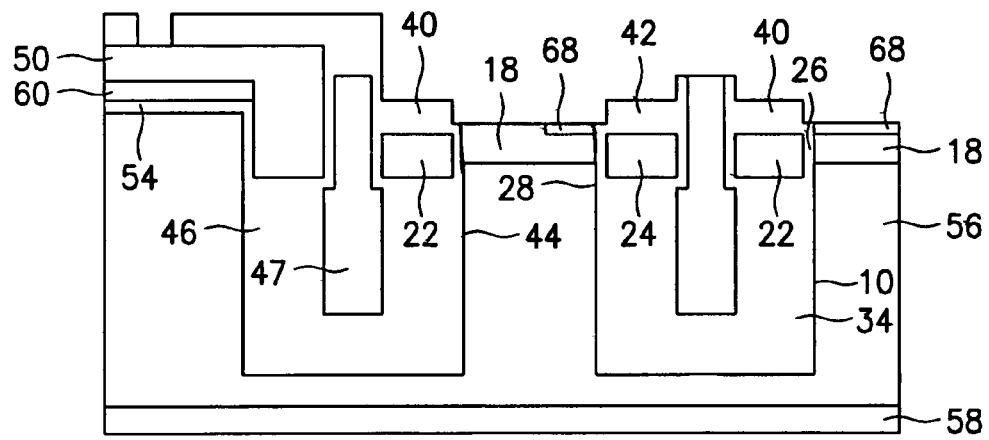
Figure 2M:
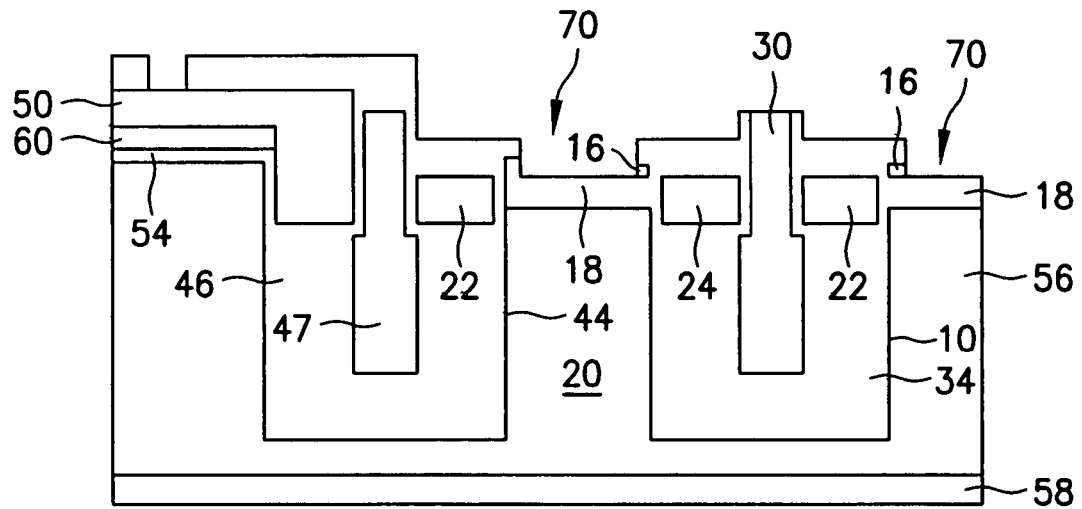
Figure 2N:
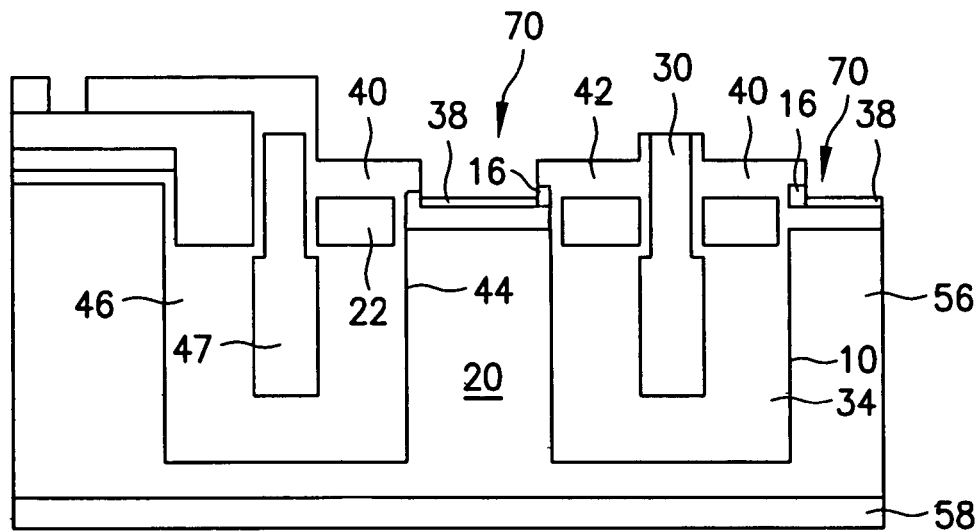

FIGS. 2A-2N schematically illustrate the intermediate structures obtained as a result of a process for fabricating a device according to the present invention.

DETAILED DESCRIPTION OF THE FIGURES

Referring to FIG. 1, a power semiconductor device according to the preferred embodiment of the present invention is a trench type MOSFET, which in the active area thereof includes trench 10 in semiconductor body 56. Trench 10 extends from the top 14 of semiconductor body 56 through source regions 16, and base region 18 into drift region 20. Trench 10 is preferably stripe shaped, but may also be cellular.

A device according to an embodiment of the present invention includes: first gate electrode 22 adjacent one sidewall of trench 10 and spanning base region, 18; second gate electrode 24 adjacent the opposing sidewall of trench 10 and spanning base region 18; first gate insulation 26 interposed between base region 18 and first gate electrode 22; second gate insulation 28 interposed between second gate electrode 24 and base region 18; and source field electrode 30 having a first portion disposed between first and second gate electrodes 22, 24 and a second portion disposed below first and second gate electrodes 22, 24. First gate electrode 22 and second gate electrode 24 are electrically connected to one another so that they may be activated together, but are insulated from source field electrode 38. Specifically, the first portion of source field electrode 30 is insulated from first and second gate electrodes 22, 24 by respective insulation bodies 32, and insulated from drift region 20 by bottom insulation body 34, which is preferably thicker than first and second gate insulations 26, 28. Preferably, bottom insulation body 34 extends underneath first and second gate electrodes 22, 24.

The device further includes source contact 36 which is electrically connected to source regions 16, source field electrode 30, and high conductivity contact regions 38 in base region 18. To insulate gate electrodes 24, 26 from source contact 36, first insulation cap 40 is interposed between source contact 36 and first gate electrode 22, and second insulation cap 42 is interposed between source contact 36 and second gate electrode 24. Thus, a device according to the present invention includes two insulated gate electrodes, and a source field electrode which is electrically connected to the source contact and disposed between the two gate electrodes and extends to a position below the gate electrodes.

In the preferred embodiment of the present invention, the first portion of source field electrode 30 extends out of trench 10 and above surface 14 of semiconductor body 56. It should be noted that caps 40, 42 may also extend out of trench 10 and above surface 14 of semiconductor body 56.

Semiconductor body 56 is preferably comprised of silicon, which is epitaxially formed over a semiconductor substrate 58, such as a silicon substrate. The preferred embodiment further includes drain contact 43, which is in ohmic contact with substrate 58, whereby vertical conduction between source contact 36 and drain contact 43 is made possible. As would be readily apparent to a skilled person, source regions 16 would be of the same conductivity as drift region 20 and substrate 58, e.g. N-type, while base region 18 and high conductivity contact regions 38 are of another conductivity, e.g. P-type. Also, in the preferred embodiment, first and second gate electrodes 22, 24 and source field electrode 30 are composed of conductive polysilicon, and gate insulations 26, 28, insulation caps 40, 42, insulation bodies 32, and bottom insulation body 34 are composed of silicon dioxide.

The features described so far belong to a single active cell of a device in the Active Area of a device according to the present invention. Although not shown, it should be appreciated that a device according to the present invention would include a plurality of active cells in the Active Area, which have not been shown here for the sake of brevity.

A device according to the preferred embodiment of the present invention includes a termination structure disposed in the Termination Area which surrounds the Active Area. The termination structure in the preferred embodiment includes termination trench 44, and field oxide 46 disposed within termination trench 44 adjacent at least the active area and the bottom of termination trench 44, and preferably adjacent both sidewalls of termination trench 44 and its bottom. Disposed adjacent to field oxide 44 is termination field plate 47. Termination field plate 47 is preferably composed of conductive polysilicon.

Also seen in FIG. 1 is gate contact 48. Gate contact 48 is electrically connected to gate runner 50, which is in turn connected to gate electrodes 22, 24. Specifically, gate runner 50, is electrically connected to a second gate electrode disposed within termination trench 44, and thus electrically connected to all gate electrodes 22, 24 within the Active Area as well. Gate runner 50 is preferably composed of conductive polysilicon and resides over thick insulation body 52.

In the preferred embodiment, source contact 36, drain contact 42 and gate contact 48 are composed of any suitable metal such as aluminum or aluminum silicon.

A method for fabricating a device according to the present invention is next described with reference to FIGS. 2A-2N.

Referring first to FIG. 2A, a layer of pad oxide 54 is grown over semiconductor body 56. Semiconductor body 56 is preferably an epitaxial silicon of one conductivity, e.g. N-type, that is grown over a semiconductor substrate 58, which is preferably a silicon substrate of the same conductivity, but of lower resistivity (higher concentration of dopants). A layer of silicon nitride 60 ($Si_3N_4$) (which is an oxidation retardant material) is then deposited over pad oxide 54.

Referring next to FIG. 2B, $Si_3N_4$ 60 layer and pad oxide 54 are patterned to form a trench mask over semiconductor body 56, and, in an etching step termination trench 44 and trench 10 are defined in semiconductor body 56. It should be noted that although not shown a plurality of trenches 10 are formed in the Active Area of the device during this step. Thereafter, a sacrificial oxide is grown over the sidewalls and the bottom of termination trench 44 and trenches 10, etched, and then pad oxide is grown over the sidewalls and the bottom of termination trench 44 and trenches 10 to obtain the structure shown in FIG. 2C.

Referring next to FIG. 2D, polysilicon 62 is deposited over the structure shown in FIG. 2C. Thereafter, polysilicon 62 is oxidized to form silicon dioxide 64 ($SiO_2$) as seen in FIG. 2E.

It should be noted that oxide 64 does not completely fill trenches 10 and termination trench 44, but that a space 65 remains in both trenches.

Next, a conductive polysilicon body 66 is formed in each respective space 65 as seen in FIG. 2F. Polysilicon bodies 66 may be formed by depositing polysilicon, doping the polysilicon and then etching the doped polysilicon to define bodies 66, or by in situ doping (i.e. doping while depositing the polysilicon). Thereafter, oxide 64 is removed to define bottom oxide 34 and field oxide 46 in termination trench 44 as seen in FIG. 2G.

Referring next to FIG. 2H, the exposed portions of conductive polysilicon bodies 66 extending above bottom oxide 34 and field oxide 46 are oxidized, whereby insulation bodies 32 are formed over termination field plate 47 and source field electrodes 30. It should be noted that during this oxidation step the exposed portions of the sidewalls of trenches 10 and termination trench 44 are also oxidized to form gate insulations 26, 28.

Next, the polysilicon for forming gate electrodes 22, 24 and gate runner 50 is deposited and made conductive by implanting dopants after deposition or during deposition (i.e. in situ doping). Thereafter, using preferably photolithography, the deposited polysilicon is selectively removed to define gate electrodes 22, 24 and gate bus 50 as seen in FIG. 2I. A low density oxide such as TEOS or the like is then deposited over the structure shown in FIG. 2I and selectively etched to define insulation caps 40, 42 over gate electrodes 22, 24, and an opening for access by gate contact 48 to gate runner 50. It should be noted that an oxide from the top surface of source field electrodes 30 is removed to expose a top portion thereof as seen in FIG. 2J.

Next, $Si_3N_4$ 60 is removed from the Active Area, channel dopants are implanted and driven to form base region 18 and define drift region 20. Note that preferably no channel dopants are implanted beyond termination trench 44. Thereafter, a source mask is applied, pad oxide 54 is etched away form the Active Area to expose base region 18, and source dopants are implanted to form source implant regions 68 or as seen in FIG. 2L.

Referring next to FIG. 2M, oxide spacers are formed adjacent insulation caps 40, 42 to extend over source implant regions 68. Then, a portion of base region 18 is removed to form recesses 70 therein. It should be noted that the top surface of semiconductor body 56 is now the top surface 14 of source implant regions 68, and as seen in FIG. 2M source field electrodes 30 rise above surface 14. Next, source implants in source implant regions 68 are driven in a diffusion drive to form source regions 16. Thereafter, dopants of the same conductivity as that of base region 18 are implanted at the bottom of recesses 70, and activated to form high conductivity contact regions 38 as seen in FIG. 2N.

Finally, top metal is deposited and patterned to define source contact 36, and gate contact 48, and bottom metal is deposited to form drain contact 43, whereby a device according to the present invention as illustrated by FIG. 1 is obtained.

The preferred embodiment shown herein is a power MOSFET. It should be noted that other power devices such as IGBTs, ACCUFETs and the like may be devised according to the principles disclosed herein without deviating from the scope and the spirit of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
   a semiconductor body having a common conduction region of one conductivity, and a base region of another conductivity, said semiconductor body including a first surface;
   a trench extending from said first surface through said base region and into said common conduction region, said trench including at least two opposing sidewalls and a bottom;
   a first gate insulation adjacent one of said sidewalls;
   a first gate electrode adjacent said first gate insulation and spanning said base region;
   a second gate insulation adjacent the other of said sidewalls;
   a second gate electrode adjacent said second gate insulation and spanning said base region;
   a source field electrode having a first portion and a second portion, said first portion of said source field electrode being disposed between said first and said second gate electrodes and insulated from the same by an insulation body, and said second portion of said source field electrode being disposed below said first portion and said gate electrodes;
   a source region adjacent each sidewall of said trench; and
   a source contact electrically connected to said source field electrode and said source regions, wherein said source field electrode extends out of said trench and above said first surface of said semiconductor body.

2. A semiconductor device according to claim 1, further comprising a first insulation cap interposed between said source contact and said first gate electrode and a second insulation cap interposed between said source contact and said second gate electrode, wherein said source field electrode is disposed between said first insulation cap and said second insulation cap.

3. A semiconductor device according to claim 1, further comprising a bottom insulation body disposed between said second portion of said source field electrode and said sidewalls and said bottom of said trench.

4. A semiconductor device according to claim 3, wherein said bottom insulation body is thicker than said gate insulations.

5. A semiconductor device according to claim 4, wherein said bottom insulation body is disposed below both gate electrodes.

6. A semiconductor device according to claim 1, wherein said source field electrode is comprised of conductive polysilicon.

7. A semiconductor device according to claim 1, wherein said gate electrodes are comprised of conductive polysilicon.

8. A semiconductor device according to claim 1, wherein said semiconductor body is comprised of epitaxial silicon.

9. A semiconductor device according to claim 8, wherein said epitaxial silicon is formed over a silicon substrate, and further comprising a drain contact ohmically connected to said silicon substrate.

10. A MOSgated power semiconductor device comprising:
    an active area including at least one active cell, said active cell including at least one source region, a source contact electrode connected to said source region, a source field electrode including a first portion of a first width and a second portion of a second width, the first width being less than the second width, the source field electrode being electrically connected to said source contact, and an insulated gate electrode adjacent one side of said source field electrode and a base region, said second portion of said source field electrode extending to a depth below a depth of said insulated gate electrode and said first portion of said source field electrode extending to a height above a height of said insulated gate electrode, wherein said source field electrode and said insulated gate electrode reside within a common trench.

11. A device according to claim 10, further comprising another insulated gate electrode residing within said common trench and adjacent another side of said source field electrode and said base region.

12. A device according to claim 11, wherein each insulated gate electrode includes a respective electrode said electrode being electrically connected to one another.

13. A device according to claim 10, further comprising an insulation body adjacent a bottom portion of said source field electrode.

14. A device according to claim 10, wherein said common trench is defined in a semiconductor body and extends from a top surface of said semiconductor body to a drift region within said semiconductor body, said source field electrode extending to a height above said top surface of said semiconductor body.

15. A device according to claim 10, further comprising a termination area adjacent said active area having a termination structure, said termination structure including a termination trench adjacent said active area.

16. A device according to claim 10, wherein said insulated gate electrode includes a conductive gate electrode and further comprising a gate bus electrically connected to said gate electrode and a gate contact.

17. A device according to claim 10, further comprising a drain contact.

18. A device according to claim 10, wherein said insulated gate electrode includes an insulation cap that extends over said source region.

19. A device according to claim 11, wherein each insulated gate electrode includes a respective insulation cap, said source field electrode extending to a height above said insulation caps.

* * * * *